United States Patent
Cho et al.

(10) Patent No.: US 7,329,918 B2
(45) Date of Patent: Feb. 12, 2008

(54) SEMICONDUCTOR MEMORY DEVICE INCLUDING STORAGE NODES AND RESISTORS AND METHOD OF MANUFACTURING THE SAME

(75) Inventors: Chang-Hyun Cho, Gyeonggi-do (KR); Tae-Young Chung, Gyeonggi-do (KR); Yong-Seok Ahn, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 11/419,710

(22) Filed: May 22, 2006

(65) Prior Publication Data

US 2006/0211192 A1    Sep. 21, 2006

Related U.S. Application Data

(62) Division of application No. 10/843,837, filed on May 11, 2004, now Pat. No. 7,074,667.

(30) Foreign Application Priority Data

May 15, 2003    (KR) ............... 2003-30904

(51) Int. Cl.
- *H01L 27/108* (2006.01)
- *H01L 29/76* (2006.01)
- *H01L 29/94* (2006.01)
- *H01L 31/119* (2006.01)

(52) U.S. Cl. ............ 257/303; 257/296; 257/311; 257/E27.088

(58) Field of Classification Search ........ 257/303, 257/E27.088
See application file for complete search history.

(56) References Cited

U.S. PATENT DOCUMENTS 6,136,643 A * 10/2000 Jeng et al. .............. 438/253

6,239,461 B1 * 5/2001 Lee ....................... 257/306
6,461,911 B2 * 10/2002 Ahn et al. ............... 438/253
6,890,841 B2    5/2005 Lee et al.
7,180,118 B2 * 2/2007 Cho et al. ............... 257/306

(Continued)

FOREIGN PATENT DOCUMENTS

| JP | 2002-231901 | 8/2002 |
|----|-------------|--------|
| KR | 1020000003644 | 1/2000 |
| KR | 2001-0076467 | 8/2001 |

OTHER PUBLICATIONS

English language abstract of Korean Publication No. 1020000003644.
English language abstract of Korean Publication No. 2001-0076467.

(Continued)

*Primary Examiner*—B. William Baumeister
*Assistant Examiner*—Igwe U. Anya
(74) *Attorney, Agent, or Firm*—Marger Johnson & McCollom, P.C.

(57) ABSTRACT

A semiconductor memory device according to embodiments of the invention includes storage nodes and resistors. A method of manufacturing the semiconductor memory device according to some embodiments of the invention includes forming an interlayer insulation layer on a semiconductor substrate including a memory cell array area and a core/perimeter area; forming a first etch stop layer thereon; forming a plurality of contact plugs arranged linearly in at least one direction on the memory cell array area; forming a first conductive layer on the resultant structure; forming a second etch stop layer thereon; etching the second etch stop layer and the first conductive layer and forming landing pads and resistors arranged non-linearly in at least one direction; and forming storage nodes on the entire outer lateral surfaces of which are exposed, on the landing pads.

8 Claims, 14 Drawing Sheets

U.S. PATENT DOCUMENTS

| | | |
|---|---|---|
| 2001/0009285 A1 | 7/2001 | Bae et al. |
| 2002/0195632 A1* | 12/2002 | Inoue et al. ................. 257/296 |
| 2003/0151082 A1* | 8/2003 | Kim et al. ................... 257/306 |
| 2004/0075156 A1* | 4/2004 | Lee et al. .................... 257/503 |
| 2004/0232558 A1* | 11/2004 | Toda ........................... 257/774 |
| 2005/0032346 A1* | 2/2005 | Graettinger ................. 438/610 |

OTHER PUBLICATIONS

English language abstract of Japanese Publication No. 2002-231901.

* cited by examiner

MEMORY CELL ARRAY AREA — — CORE/PERI AREA

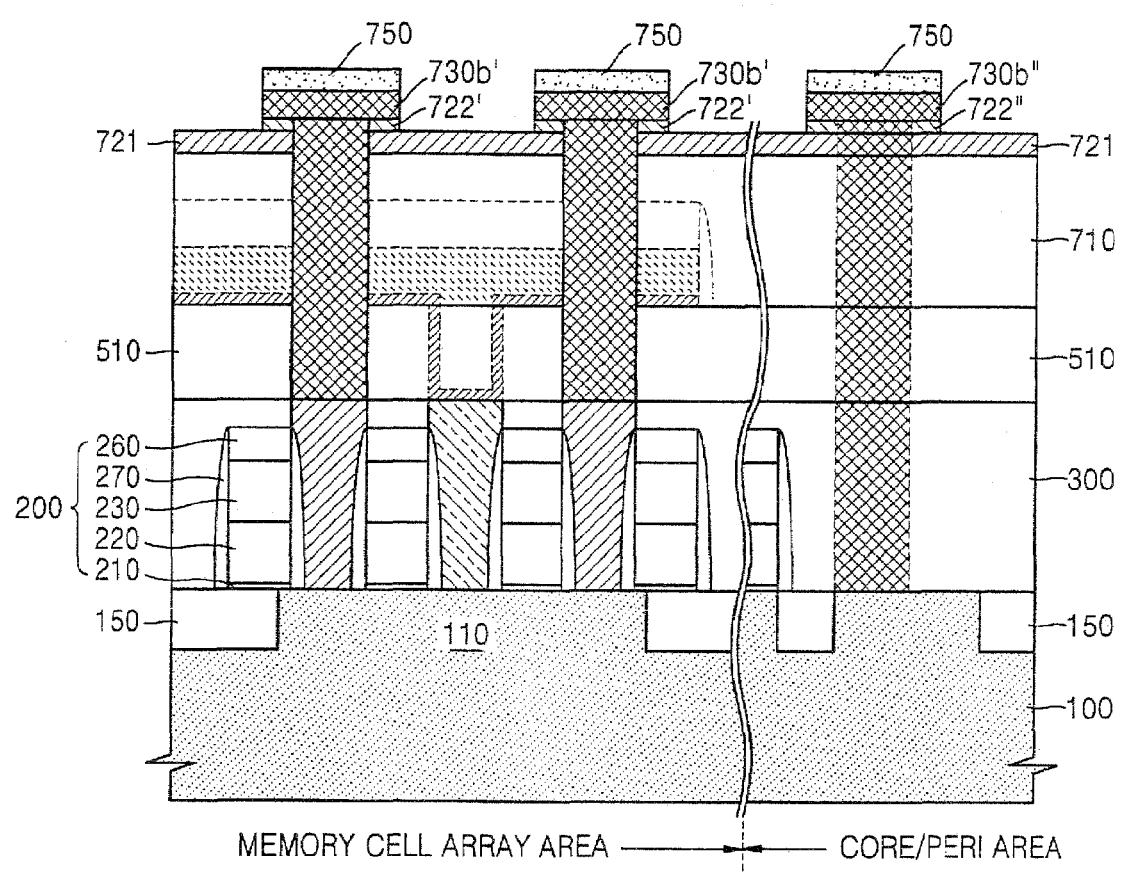

MEMORY CELL ARRAY AREA ←——→ CORE/PERI AREA

SEMICONDUCTOR MEMORY DEVICE INCLUDING STORAGE NODES AND RESISTORS AND METHOD OF MANUFACTURING THE SAME

CROSS REFERENCE TO RELATED APPLICATIONS

This application is a Divisional of U.S. patent application Ser. No. 10/843,837, filed May 11, 2004, now U.S. Pat. No. 7,074,667, which is claims priority from Korean Patent Application No. 2003-30904, filed on May 15, 2003, which is incorporated by reference in its entirety.

BACKGROUND OF THE INVENTION

1. Field of the Invention

This disclosure relates to a semiconductor device and a method of manufacturing the same, and more particularly, to a semiconductor memory device including storage nodes and resistors and a method of manufacturing the same.

2. Description of the Related Art

Along with the development of techniques to manufacture semiconductor devices, transistors have become smaller in size and the integration of semiconductor devices has advanced at a rapid pace. In particular, the integration of Dynamic Random Access Memory device (DRAM) has improved rapidly with the development of processing techniques and recently 1 Giga-bit DRAM was developed.

Conventionally, DRAM has a one-transistor/one-capacitor (1T1C) structure. Cell capacitors may be classified as stack-type capacitors or trench-type capacitors. Stack-type DRAM uses various methods to ensure a sufficient cell capacitance in a narrower area. One of these methods is to form a cylinder shaped storage node (One Cylinder Storage: OCS). Since an OCS-type capacitor has a wide available surface area including all the inner and the outer surfaces of its cylindrical structure, the OSC-type capacitor is highly regarded because it can be subjected to substantial mass-production in correspondence with design rule reduction.

However, the OCS-type capacitor has a high probability of causing a failure such as a two-bit failure, in which the storage nodes lean to one side or collapse as a result of the design rule reduction. This is because the intervals between storage nodes and the widths of storage electrodes have been greatly reduced.

FIG. 1 is a plan diagram illustrating a conventional semiconductor memory device including storage nodes.

Referring to FIG. 1, storage nodes 50 of a conventional OCS-type capacitor are arranged along bit lines 30 and gate lines 20 that are orthogonal to each other. The arrangement of the storage nodes 50 forms isolation areas on a semiconductor substrate.

When DRAM has a design rule of 0.1 µm, the longitudinal length of a storage node 50 is about 300 nm and the width thereof is about 120 nm. The interval between such storage nodes is only about 80 nm. Also, to ensure a sufficient capacitance, the height of the storage node 50 should be greater than 15000 Å.

Thus, the height-to-width ratio of the storage node 50 is generally greater than 12. That is, the height of the storage node is considerably higher compared to its width. Also, the interval between the storage nodes 50 is considerably narrow compared to the height of the storage nodes. Accordingly, a probability that the storage nodes 50 lean to one side or collapse is very high. Also, if the storage nodes 50 lean to one side or slightly lean to one side, the storage nodes may contact one another. If the storage nodes 50 contact one another, a two-bit failure (described above) will occur. Furthermore, the probability of a two-bit failure greatly increase if the design rule is reduced below 0.1 µm.

The phenomenon that the storage nodes 50 leans to one side is related to the arrangement of the storage node 50 as described above with reference to FIG. 1. Accordingly, efforts are being made to change the arrangement of the storage nodes, for example, to increase the intervals between the storage nodes and to form the storage nodes in a square shape or a rhombus shape, etc.

However, as shown in FIG. 1, the storage node 50 overlaps a storage node contact plug 41 formed on an active area 11 of the semiconductor substrate. If the location of the storage node 50 is changed, the storage node 50 may not overlap the storage node contact plug 41. Also, since the storage node contact plug 41 should be electrically isolated from bit line contact plugs 45 which electrically connect the bit lines 30 with the active areas 11 of the semiconductor substrate, it is very difficult to change the location of the storage node contact plug 41.

A promising method for manufacturing DRAM with a sufficient cell capacitance is to use high-dielectric materials. That is, research is actively carried out on methods that form a dielectric film for a capacitor using materials with a great dielectric constant such as a tantalum oxide film or BST ($BaSrTiO_3$) film.

However, when a dielectric film is formed with high-dielectric materials, it is difficult to form storage nodes and/or upper electrodes of a capacitor with polysilicon as in a conventional technique. This is because high-dielectric material such as a tantalum oxide film or BST is reactive with polysilicon. Such reaction of a dielectric film and polysilicon may deteriorate the electrical properties of the cell capacitor. Accordingly, research has been carried out on methods to form the storage nodes and/or the capacitor upper electrodes with different materials in order to avoid the above-described problem while maintaining the advantages of the high-dielectric materials. Particularly, research has been actively carried out on Metal-Insulator-Semiconductor (MIS) capacitors and Metal-Insulator-Metal (MIM) capacitors.

Also, resistors are formed on a core/perimeter area (not shown) in order to obtain a desired voltage different from an input voltage. In a case where a capacitor is made with polysilicon, these resistors can be formed together when capacitors are formed on a memory cell array area. However, if the capacitor electrodes are formed with metal materials, the resistors cannot be formed together when the capacitors are formed. This is because resistors formed with metal materials have a resistance lower than polysilicon and accordingly a desired voltage cannot be obtained. Therefore, when capacitors are formed with metal materials, an additional process that forms resistors using polysilicon on a core/perimeter area is necessary.

Embodiments of the invention address these and other disadvantages of the conventional art.

SUMMARY OF THE INVENTION

Embodiments of the invention provide a semiconductor memory device including storage nodes and resistors, wherein the semiconductor memory device has a sufficient cell capacitance, is less susceptible to two-bit failure due to leaning or collapsing of the storage nodes, and does not require an additional process for forming resistors on a core/perimeter area.

Other embodiments of the invention provide a method of manufacturing the semiconductor memory device described above.

BRIEF DESCRIPTION OF THE DRAWINGS

The above and other features and advantages of the invention will become more apparent by describing in detail exemplary embodiments thereof with reference to the attached drawings.

DETAILED DESCRIPTION OF THE INVENTION

Figure 1:
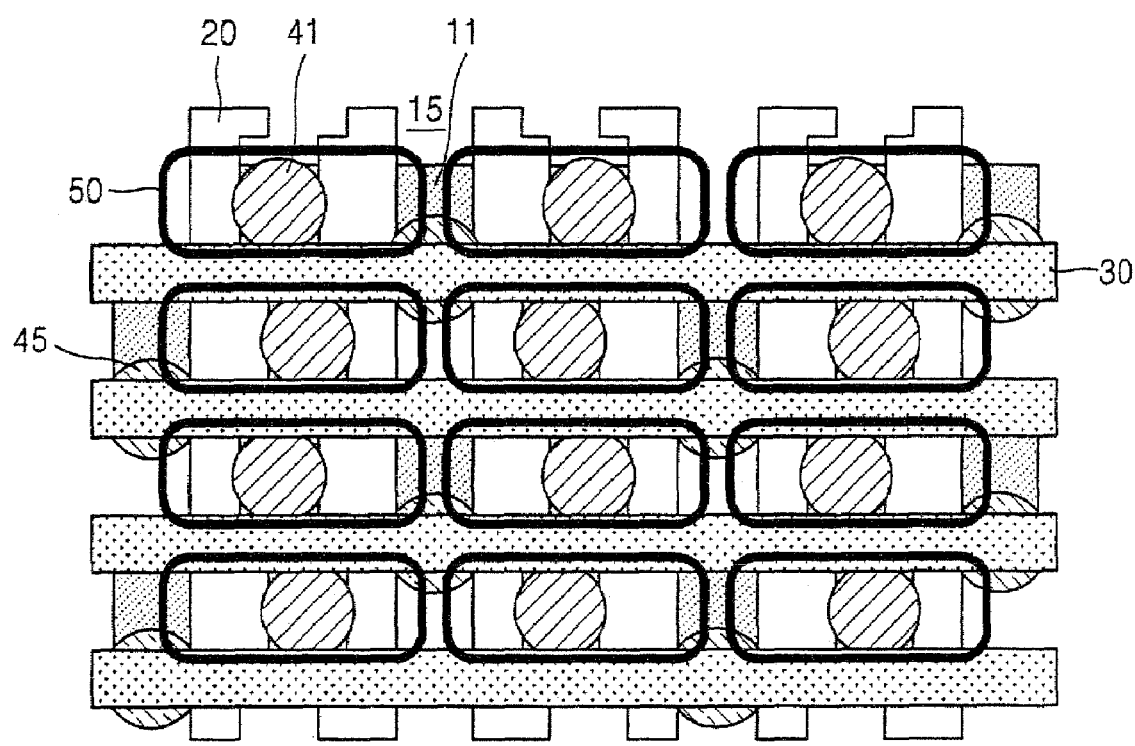
FIG. 1 is a plan diagram illustrating a conventional semiconductor memory device that includes storage nodes.

Hereinafter, several embodiments of the invention will be described in detail with reference to the appended drawings. In the drawings, the thickness of layers may be exaggerated for clarity, and the same reference numerals are used to denote the same elements throughout the drawings.

FIGS. 2 through 9 are diagram illustrating a semiconductor memory device including storage nodes and resistors and a method of manufacturing the same, according to some embodiments of the invention.

Figure 2A:
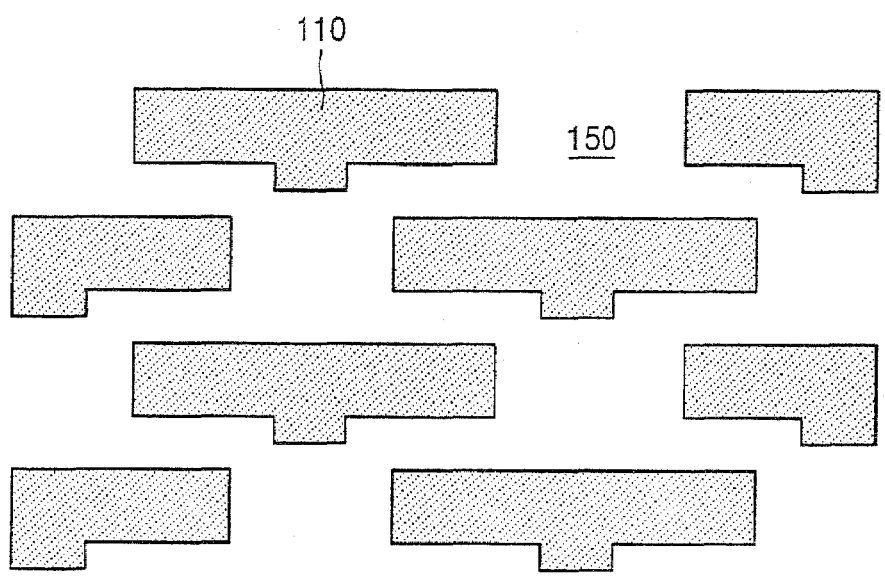
FIGS. 2a through 9 are views for describing a semiconductor memory device including storage nodes and resistors and a method of manufacturing the same, according to embodiments of the present invention.
Figure 2B:
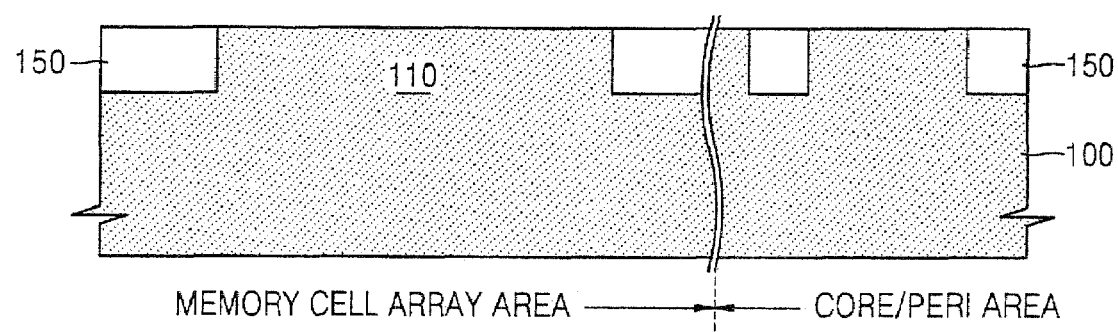

FIG. 2A is a plan diagram illustrating active areas 110 defined on a memory cell array area of a semiconductor substrate in accordance with some embodiments of the invention. FIG. 2B is a cross-sectional diagram illustrating the memory cell array area of FIG. 2A and an adjacent core/perimeter area.

Referring to FIGS. 2A and 2B, an active area 110 and an isolation area 150 are defined on a semiconductor substrate 100 including memory cell array areas and core/perimeter areas. A device isolation process such as a trench device isolation process may be performed. In this case, trenches may be formed according to a predetermined design rule, for example, the trenches are formed to a depth of about 2500 Å through 3000 Å. Thereafter, a photolithography process and an ion-implantation process for forming wells (not shown) and channels (not shown) of transistors on the semiconductor substrate 100 may be performed.

Figure 3A:
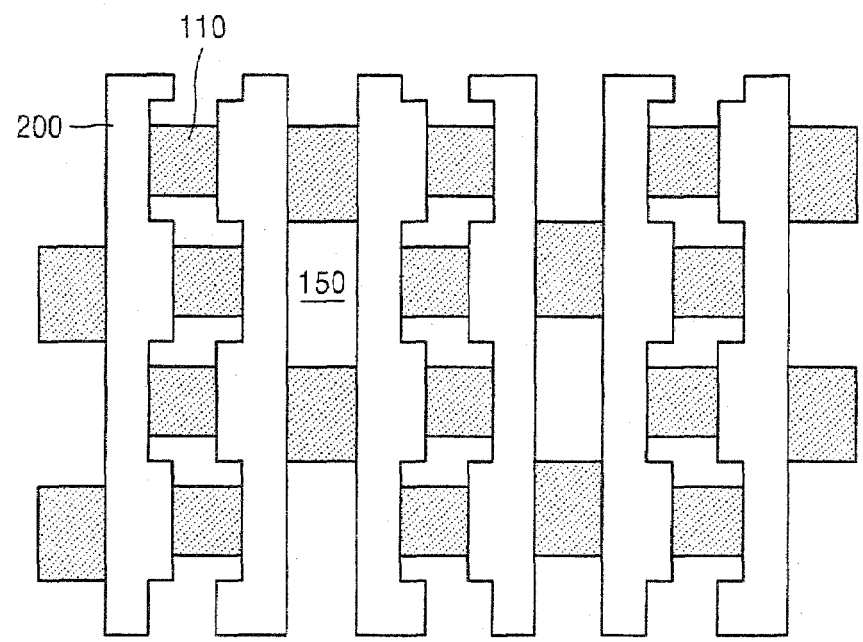
Figure 3B:
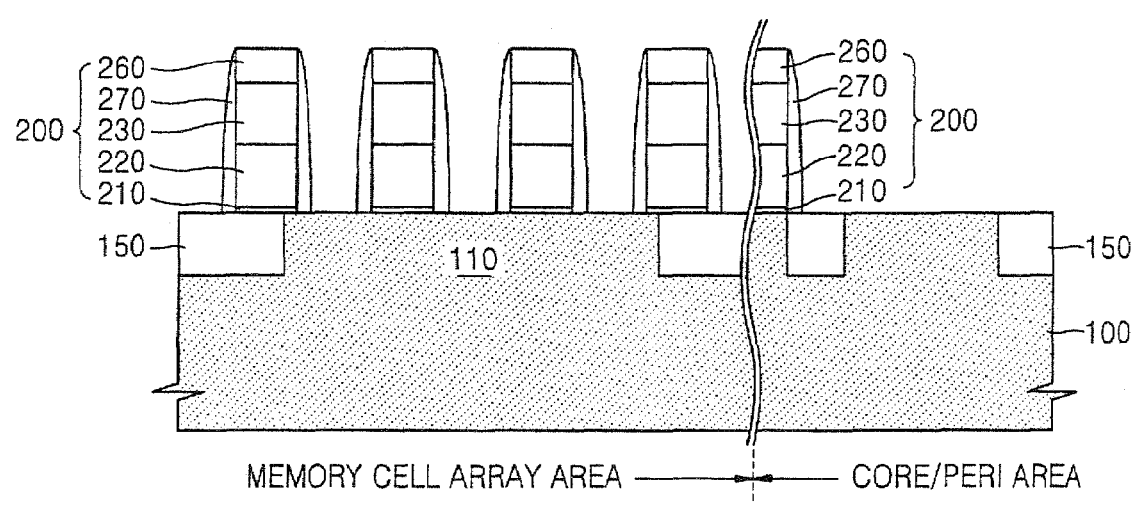

FIGS. 3A and 3B are plan and cross-sectional diagrams, respectively, illustrating a plurality of gate lines 200 formed on the semiconductor substrate in accordance with some embodiments of the invention.

Referring to FIGS. 3A and 3B, native oxide films (not shown) that exist on the active area 110 are removed. Then, a gate oxide film 210 is formed to a thickness of about 40-60 Å on the active area 110. The gate oxide film 210 may be formed using, for example, a thermal oxidation method. The thickness of the gate oxide film 210 may be varied to give different device properties.

Gate layers 220 and 230 and a capping insulation layer 260 are formed successively on the gate oxide file 210. The gate layers 220 and 230 are formed with a conductive material. For example, the gate layer 220 may be formed with a doped polysilicon layer to a thickness of approximately 1000 Å. The gate layer 230 may be formed of a metal silicide, for example, a tungsten silicide layer, to a thickness of approximately 1000 Å on the gate layer 220, in order to improve gate conductivity. Then, a capping insulation layer 260 made of, for example, silicon nitride, is formed to a thickness of approximately 2000 Å on the gate layer 230. Then, a photolithography process and an etching process are performed sequentially so that the capping insulation layer 260 and the gate layers 220 and 230 are patterned sequentially, thereby forming a plurality of gate patterns crossing through the active area 110.

Next, a photolithography process and an ion implantation process are performed in accordance with the type of transistor that is desired, i.e., NMOS or PMOS, and a source/drain area of the transistor is formed. The source/drain area may be formed with a LDD (Lightly Doped Drain) structure. Thereafter, an insulation layer is applied to cover the gate patterns and then the insulation layer is etched to form gate spacers 270. The gate spacers 270 may be formed with silicon nitride. As a result, the gate line 200 as shown in FIGS. 3A and 3B is formed.

Figure 4A:
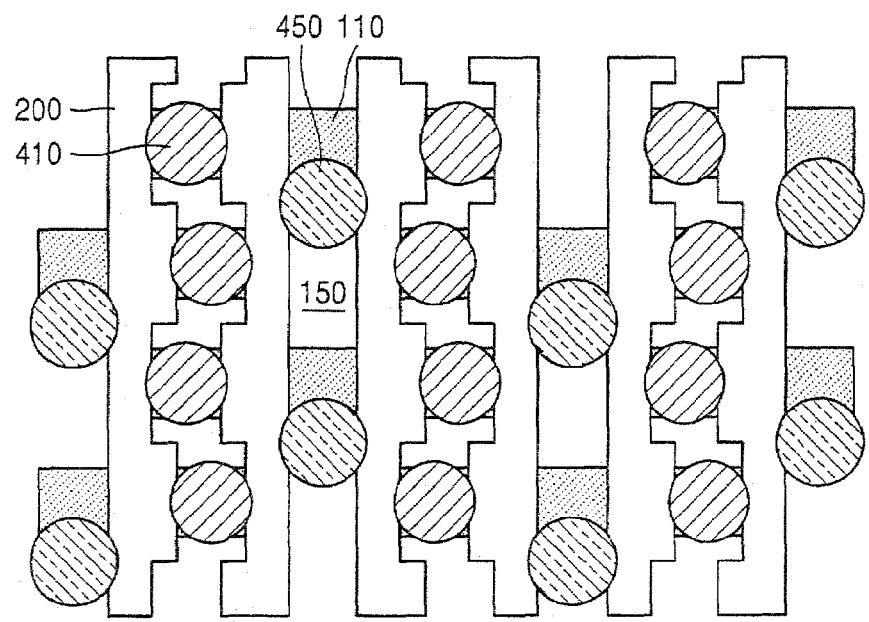
Figure 4B:
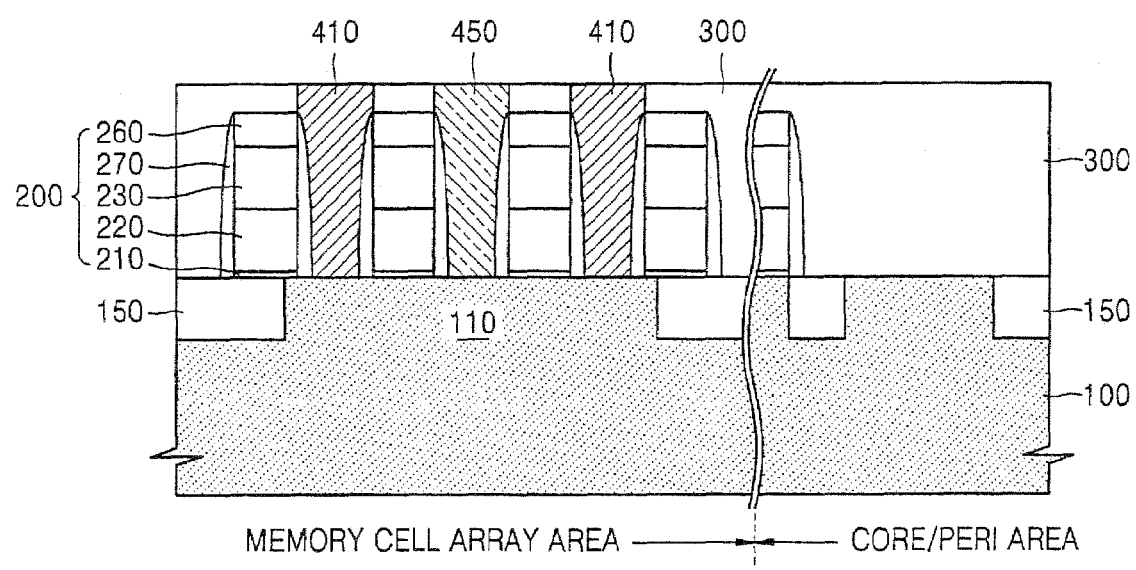

FIGS. 4A and 4B are plan and cross-sectional diagrams, respectively, illustrating contact pads 410 and 450 formed in accordance with some embodiments of the invention. Referring to FIG. 4B, it is seen that the core/perimeter area has no contact pad. However, a contact structure for electrically connecting an upper conductive body with the lower semiconductor substrate may still be formed.

Referring to FIGS. 4A and 4B, a first interlayer insulation layer 300 is formed between the gate lines 200. Such an interlayer insulation layer 300 may be formed using silicon oxide with an excellent gap-filling property such as HDP (High Density Plasma) oxide and BPSG. Then, if necessary, the first interlayer insulation layer 300 may be planarized using, for example, a chemical mechanical polishing (CMP) process.

A plurality of contact pads 410 and 450 are formed successively in the first interlayer insulation layer 300. In correspondence with design rule reduction, a SAC (Self Aligned Contact) method is used for forming the contact pads. However, any other methods capable of forming contact pads may also be used. The contact pads 410 and 450 formed on the memory cell array area may be classified either as storage node contact pads 410 for electrical connection with storage nodes or as bit line contact pads 450 for electrical connection with bit lines.

The contact pads 410 and 450 may be formed as follows. First, a portion of the first interlayer insulation layer 300 in which a contact pad is to be formed is etched using a photolithography process and a selective etch process, so that a contact hole that exposes an active area 110 is formed. Then, an ion implantation process is performed on the exposed active area 110 so that a contact resistance between the active area and contact pads 410 and 450 that will be formed later can be reduced. For example, in the case of NMOS transistors, phosphorus is implanted with a dose of 2-4E12 (atoms/cm$^2$) using approximately 30-50 keV. Thereafter, polysilicon doped with N-type impurities is applied to a thickness of approximately 5000 Å to fill the contact hole. Then, the polysilicon is etched using a dry etch-back or CMP, etc., to expose the upper surface of the first insulation layer 300. Therefore, contact pads 410 and 450 are formed as shown in FIG. 4B.

Figure 5A:
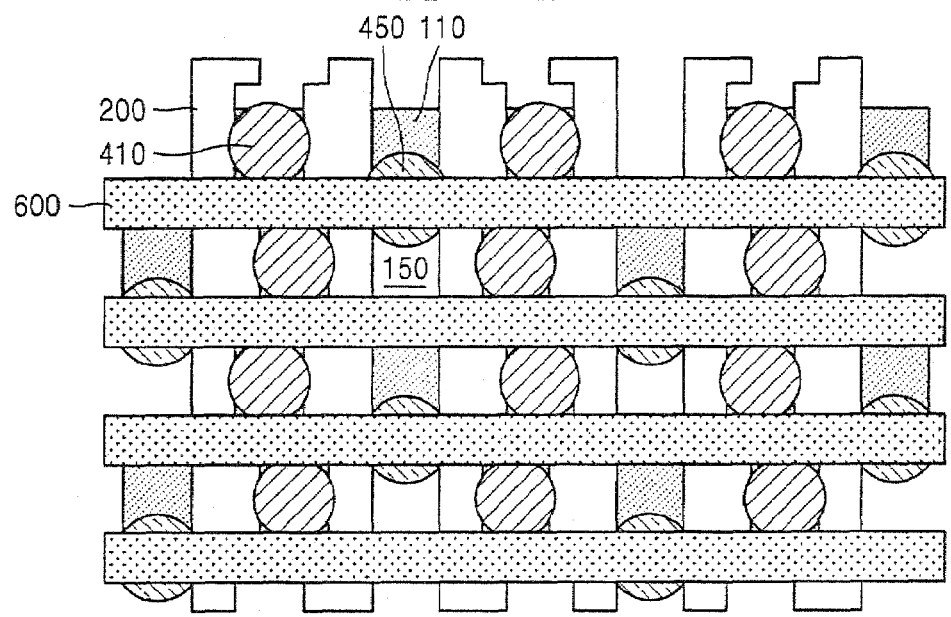
Figure 5B:
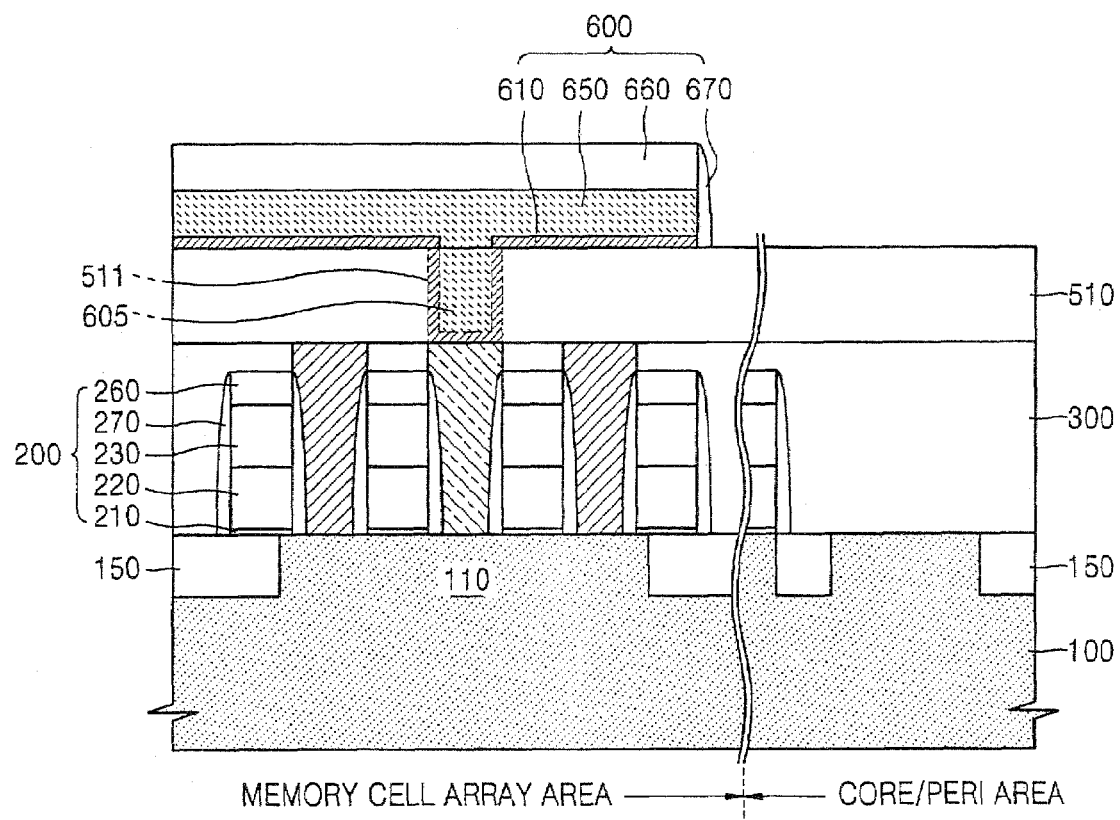

FIGS. 5A and 5B are plan and cross-sectional diagrams, respectively, illustrating bit lines 600 formed on the structure of FIG. 4 according to some embodiments of the invention.

Referring to FIGS. 5A and 5B, a second interlayer insulation layer 510 for covering the contact pads 410 and 450 is formed on the first interlayer insulation layer 300. The second interlayer insulation layer 510 can be formed to a thickness of approximately 1000-2000 Å using an insulation material such as silicon oxide.

Then, the second interlayer insulation layer 510 is patterned using a photolithography process and an etching process so that the upper surface of the bit line contact pad 450 is exposed, and a second contact hole 511 is formed. Then, a bit line contact plug 605 and a bit line 600 that is electrically connected with the bit line contact pad 450 are formed successively.

For example, a barrier metal layer 610 is formed on the second interlayer insulation layer 510 on which the second contact hole 511 is formed. Then, a metal conductive layer 650 such as a tungsten layer with a thickness of approximately 500-1500 Å and a silicon nitride layer with a thickness of approximatelly 2000 Å are deposited sequentially on the barrier metal layer 610 and then patterned. As a result, a bit line contact plug 605 is formed within the second contact hole 511 and a bit line conductive layer 650 and a capping insulation layer 660 connected with the bit line contact plug 650 are formed on the second interlayer insulation layer so as to cross the gate line 200 in a direction perpendicular to the gate line. Here, the bit line conductive layer 650 and the capping insulation layer 660 can be formed with a conductive polysilicon instead of the metal conductive layer. Also, similar to when the gate line 200 was formed, spacers 670 are formed with silicon nitride, etc. on the side-walls of the bit line conductive layer 650 and the capping insulation layer 660 to thereby form a bit line 600 as shown in FIG. 5B.

In FIG. 5B, the bit line 600 is formed only on the memory cell array area. However, predetermined conductive layer patterns may also be formed on the core/perimeter area as necessary when the bit lines 600 are formed.

Figure 6A:
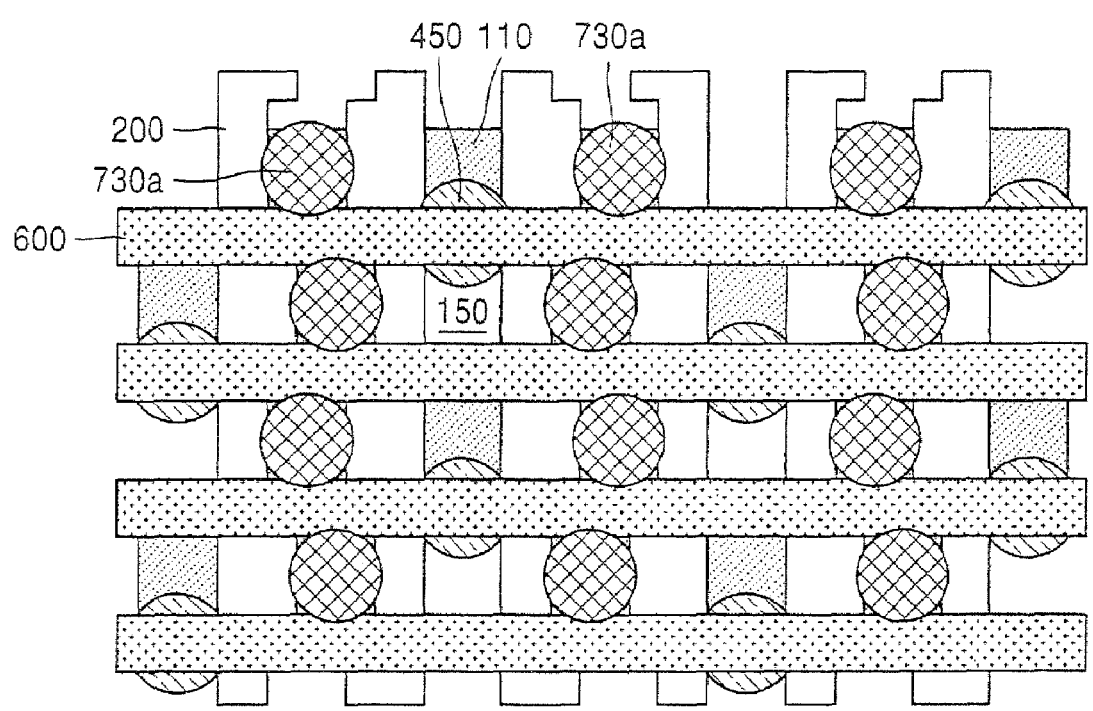
Figure 6B:
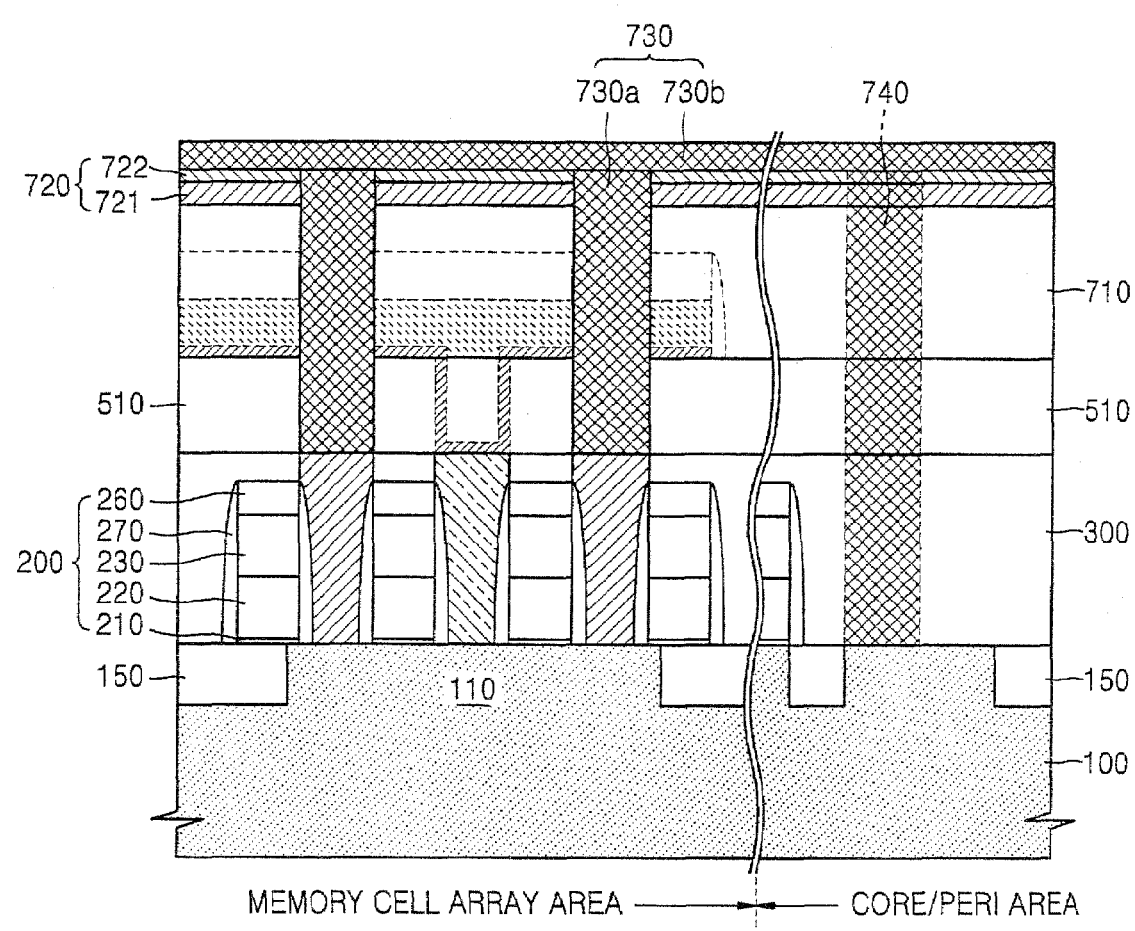

FIGS. 6A and 6B are plan and cross-sectional diagrams, respectively, illustrating a process of forming an etch stop layer 720 and a storage node contact plug 730 on the structure of FIG. 5 in accordance with some embodiments of the invention.

Referring to FIGS. 6A and 6B, after the bit line 600 is formed, a third interlayer insulation layer 710 for covering the bit line 600 is formed. For example, a silicon oxide with an excellent gap-filling property such as a HDP oxide or BPSG is formed to a thickness of approximately 2000 Å. Then, if necessary, the third interlayer insulation layer 710 may be planarized using, for example, a CMP process.

Then, a first etch stop layer 720 is formed on the third interlayer insulation layer 710. For example, the first etch stop layer 720 may be formed with silicon nitride to a thickness of approximately 2000 Å. As shown in FIG. 6B, the first etch stop layer 720 may also be formed as a combination layer consisting of a silicon nitride layer 721 and a polysilicon layer 722 by forming the silicon nitride 721 to a thickness of approximately 2000 Å and forming a polysilicon layer 722 to a thickness of approximately 1000 Å. If the first etch stop layer 720 is formed as the combination layer 721 and 722, the patterns of the polysilicon layer 722 that remain on the core/perimeter area may be used as one portion of resistors, as will be described below.

Thereafter, the first etch stop layer 720 and the third interlayer insulation layer 710 are etched sequentially so that a third contact hole is formed to expose the lower storage node contact pad 410 on the memory cell array. Also, an opening hole (the opening hole can be formed to expose the semiconductor substrate or expose the conductive pattern over the semiconductor substrate) can be formed in the core/perimeter area to expose the lower conductive layer as necessary.

Next, the third contact hole (and opening hole) is filled with a conductive material, for example, conductive polysilicon, so that a polysilicon layer 730 is formed to a thickness of approximately 1000-2000 Å on the etch stop layer 720. Thus, a storage node contact plug 730a and a conductive layer 730b for forming a landing pad are formed on the memory cell array area, and a contact 740 and a conductive layer 730b for forming resistors are formed on the core/perimeter area. In FIG. 6A, the landing pad and the conductive layer 730b are not shown.

Figure 7A:
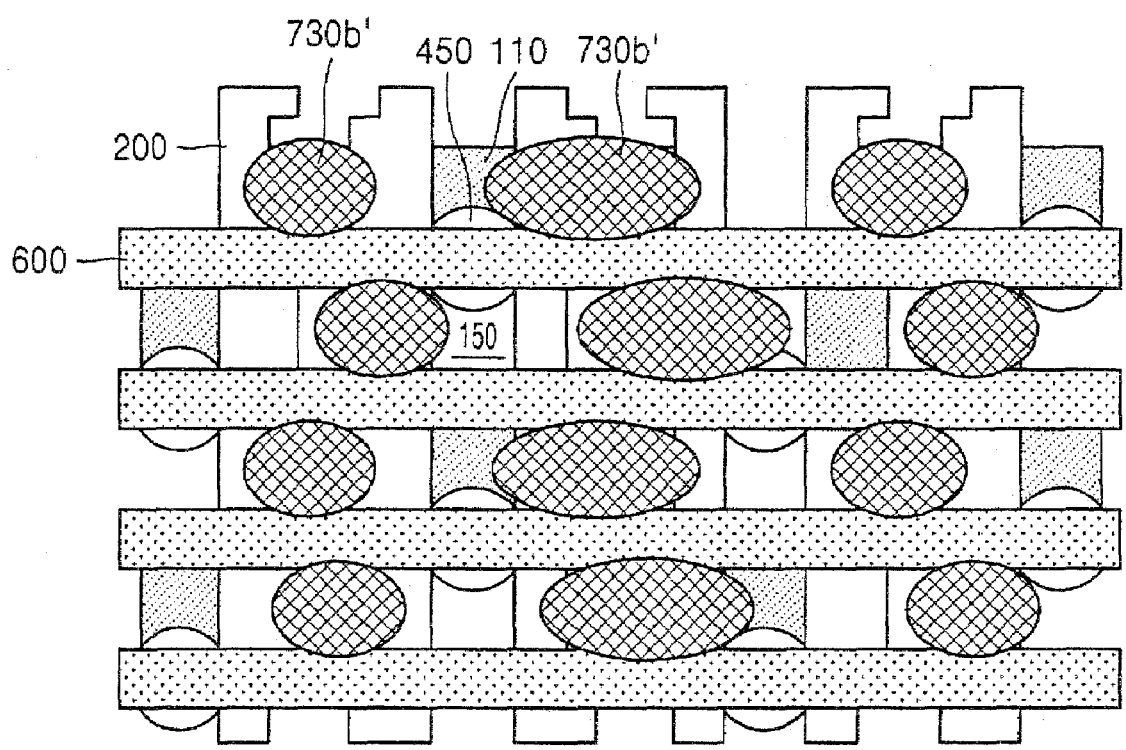

FIGS. 7A and 7B are plan and cross-sectional diagrams, respectively, illustrating a process of forming a second etch stop pattern 750, a landing pad 730b', and resistors 730b" on the structure of FIG. 6 according to some embodiments of the invention.

Referring to FIGS. 7A and 7B, the second etch stop layer can be formed on the landing pad and the conductive layer 730b. The second etch stop layer can be formed to a thickness of about 500-1000 Å using silicon nitride. The reason for forming the second etch stop layer will be described later.

Then, the second etch stop layer, the conductive layer 730b, and the polysilicon layer 722 are patterned sequentially. As a result, a second etch stop layer pattern 750, a landing pad 730b', resistors 730b", and polysilcon layer patterns (722' and 722") are formed. The polysilicon layer pattern 722" of the core/perimeter area can perform the same function as resistors 730b" in a semiconductor device.

The landing pads 730b' are patterned so that they are arranged non-linearly in at least one direction. As shown in FIG. 7A, the landing pads 730b' are arranged linearly in the direction of the bit line 600 but non-linearly in the direction of the gate line 200. Preferably, the landing pads 730b' are patterned so that they are arranged with a zig-zag form in the direction of the gate line 200. Also, the landing pads 730b' are preferably patterned so that each of the landing pads 730b' has a width in the direction of the bit line 600 that is larger than that of the storage node contact plug 730a, and so that neighbouring landing pads centering on the bit line 600 are arranged in a zig-zag form. This arrangement is aimed to ensure electrical connection of storage node contact plugs 730a with the storage nodes that will be formed later, and also to arrange the storage nodes in a zig-zag form.

Also, the resistors 730b" on the core/perimeter area can be patterned in a predetermined form in accordance with the type of semiconductor device.

The landing pads 730b' may be formed with the same size. However, as shown in FIG. 7A, the neighbouring landing pads 730b centering on the gate line 200 may also be formed with different sizes. That is, the landing pads 730b' may be patterned so that a larger landing pad and a smaller landing pad are arranged alternately in the direction of the bit line 600.

Figure 8A:
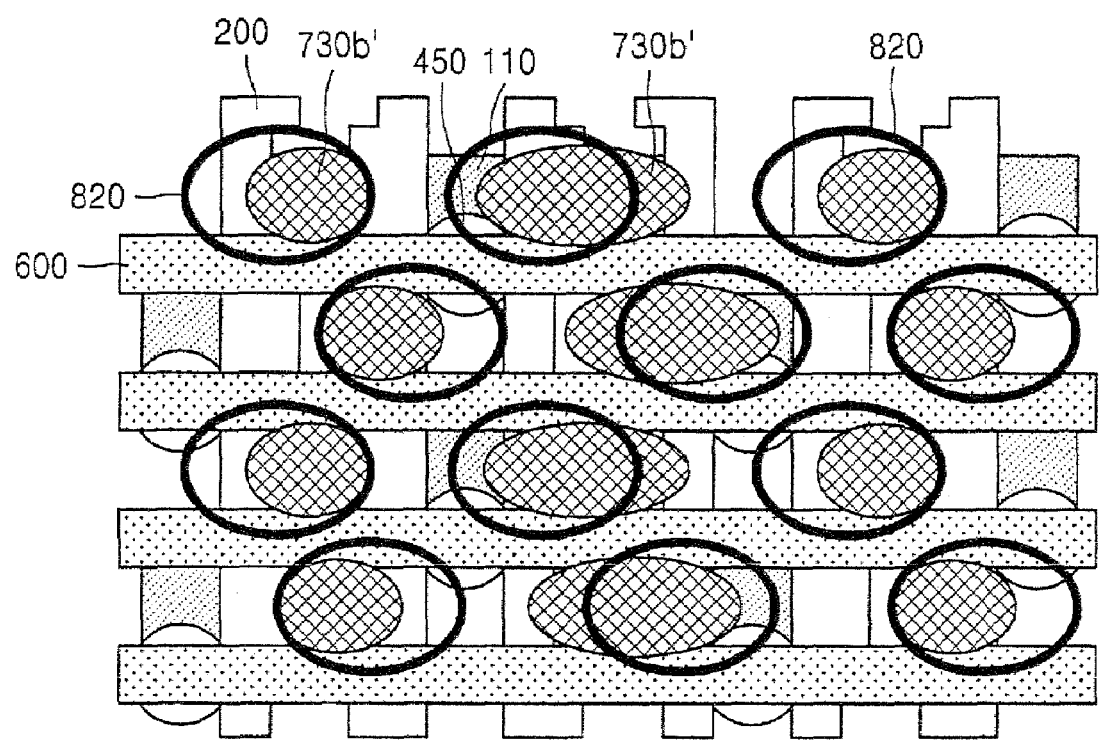
Figure 8B:
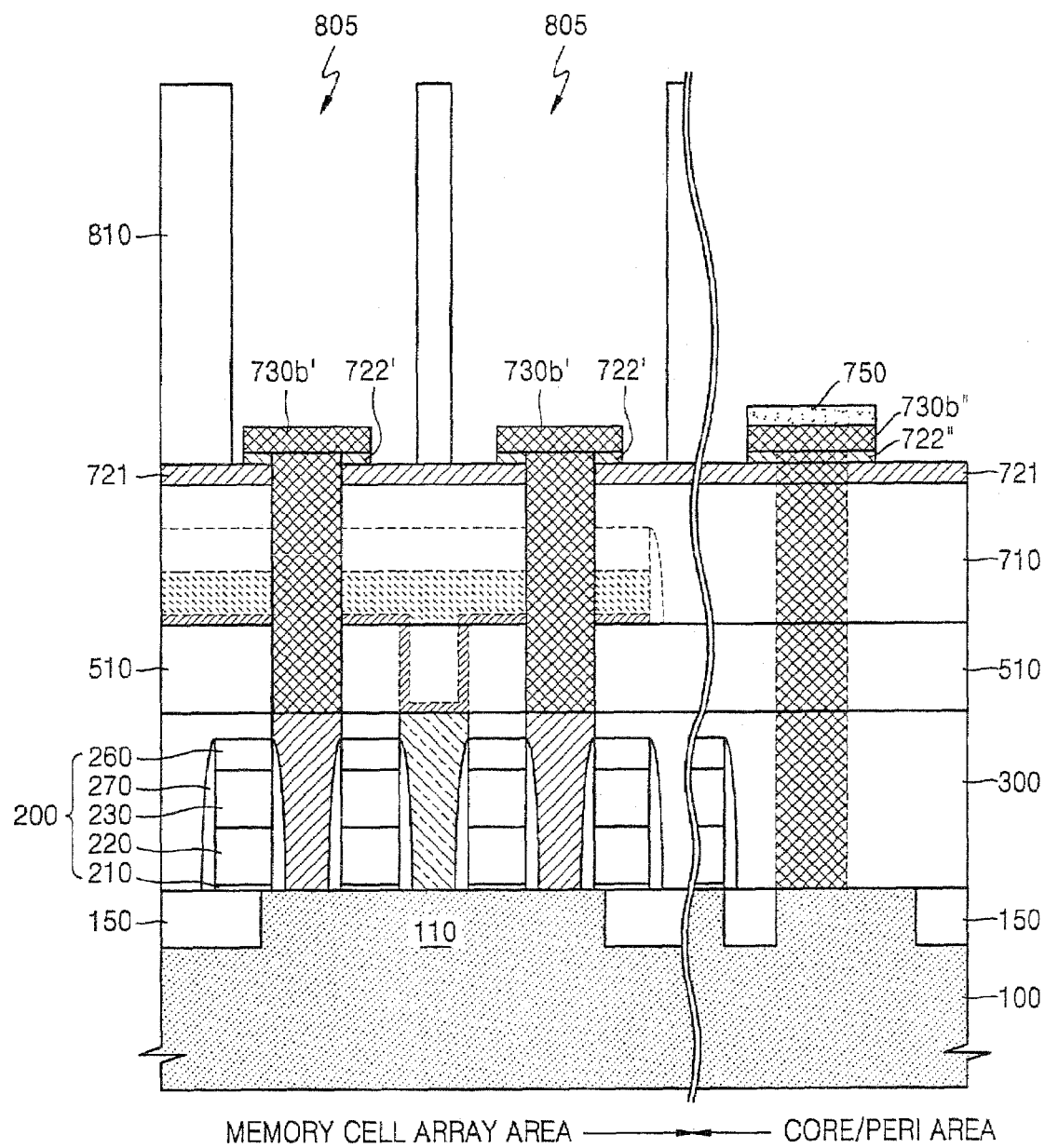
Figure 8C:
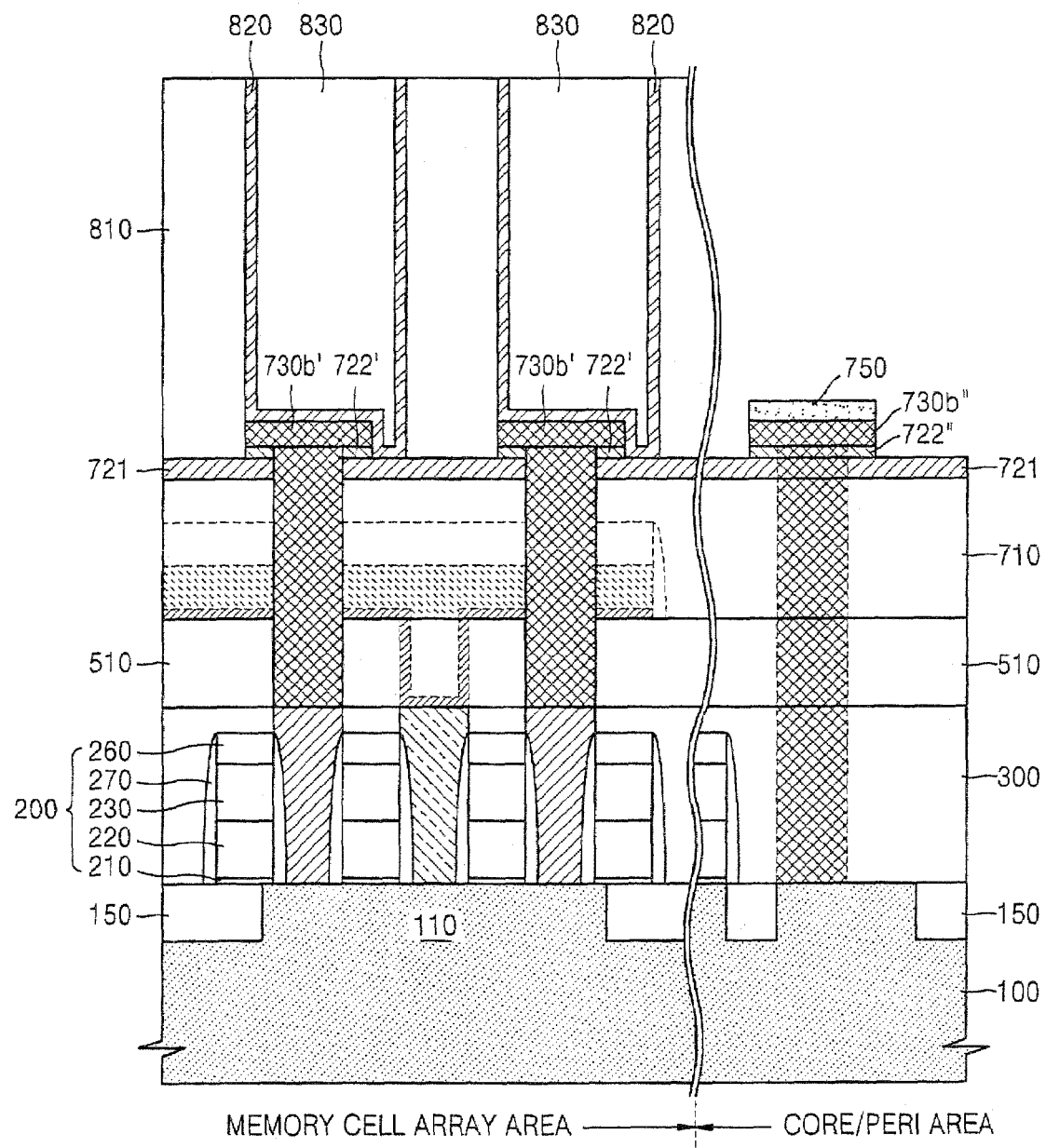
Figure 8D:
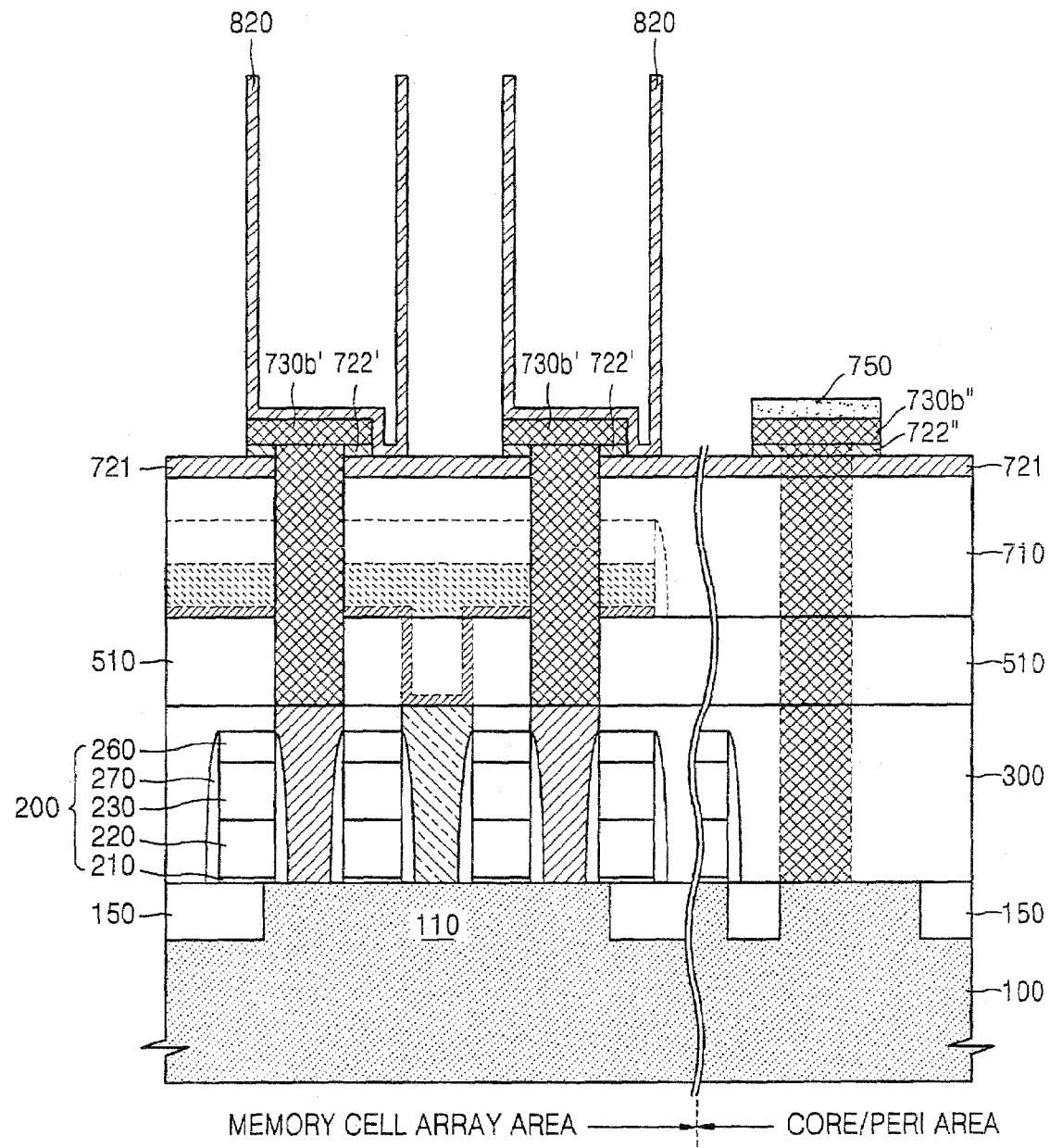

FIG. 8A is a plan diagram illustrating a planar arrangement of the storage nodes 820 that are formed on the structure of FIG. 7 in accordance with some embodiments of the invention. FIGS. 8B, 8C, and 8D are cross-sectional diagrams illustrating a process for forming the storage nodes 820 of FIG. 8A in accordance with some embodiments of the invention.

Referring to FIG. 8A, a storage node 820 of a capacitor is formed on the landing pad 730b'. At this time, the storage node 820 can be formed with a three-dimensional shape, for example, a cylindrical shape. Also, the storage nodes 820 may be arranged non-linearly in at least one of the two directions corresponding to a direction of the bit line 600 and a direction of the gate line 200. For example, the storage nodes 820 may be aligned in a direction diagonal to the direction of the bit line 600, the storage nodes may be aligned in a direction diagonal to the direction of the gate line 200, or the storage nodes may be aligned in a direction diagonal to both the direction of the bit line 600 and the direction of the gate line 200. Thus, as shown in FIG. 8A, adjacent storage nodes in the direction of the bit lines 600 are aligned, but adjacent storage nodes 820 in the direction of the gate lines 200 are not aligned.

In other words, as shown in FIG. 8A, the storage nodes 820 can be formed in a zig-zag form in the directions of the gate line 200 or the bit line 600. Accordingly, since the storage nodes 820 can be arranged non-linearly in at least one direction in the present embodiment and preferably arranged in a zig-zag form, the section of the storage node can be rectangular, circular, or oval, etc.

Under a design rule of approximately 0.1 μm, if the section of the storage node 820 is rectangular, the storage node 820 has a width of about 250 nm in the direction of the bit-line 600 and a width of about 200 nm in the direction of the gate line 200. If the height of the storage node is about 15000 Å as in the conventional technique, a height-to-width ratio of the storage node 820 is significantly reduced compared to the conventional technique wherein the height-to-width ratio is approximately 8. Accordingly, since the height-to-width ratio of the storage node 820 in the direction of the gate line 200 is reduced to approximately ⅔ compared to the conventional technique, leaning or collapsing of the storage node 820 can be efficiently prevented.

However, if a rectangular storage node 820 is formed according to the above-described embodiments, it is expected that the available area of the storage node 820 will be reduced by about 10%. However, such reduction of the available area can be compensated for by increasing the height of the storage node 820.

Also, in accordance with some embodiments of the invention, it is possible to compensate for reduction of the available area by using the entire outer surface of the storage node 820 as the available area, as will be described below. This is possible because the first etch stop layer 720 is formed below the landing pad 730b'. The landing pad 730b' below the storage node 820 substantially acts as one portion of the storage node 820.

In more detail, as shown in FIG. 8B, a mold layer 810 with an opening hole 805 which exposes the landing pad 730b' is formed on the first etch stop layer 721. The mold layer 810 can be formed by forming a sacrificial insulation layer for covering the second etch stop layer 750 and the landing pad 730b' on the first etch stop layer 721 and patterning the sacrificial insulation layer using a photolithography process and an etching process. At this time, the sacrificial insulation layer is formed slightly higher than the height of the storage node 820 to be formed using a silicon oxide such as PETEOS. For example, the sacrificial insulation layer can be formed to have a thickness thicker than approximately 15000 Å. Successively, the second etch stop layer 750 exposed through the opening hole 805 is removed.

Referring to FIG. 8C, a conductive layer, for example, a conductive polysilicon layer, is applied to a thickness of approximately 400-500 Å on the mold layer 810 and the landing pad 730b'. Then, to fill the opening hole 805, a silicon oxide such as PETEOS or USG is deposited on the conductive layer so that a sacrificial layer 590 is formed to have a thickness of approximately 3000-6000 Å.

Thereafter, the upper surface of the mold layer 805 is exposed using a dry etch-back process and/or a CMP process. At this time, the conductive layer remaining on the upper surface of the mold layer 810 is also etched and removed until it reaches approximately 1000-2000 Å. As a result, nodes of the conductive layer are divided and a cylindrical storage node 820 is formed between the mold layer 810 and the remaining sacrificial layer 830 that fills the opening hole 805.

Referring to FIG. 8D, the mold layer 810 and the remaining sacrificial layer 830 are removed to expose the entire outer and inner surfaces of the cylindrical storage node 820. At this time, the mold layer 810 and the remaining sacrificial layer 830 are removed using a high etch selection ratio between the silicon oxide layer forming the mold layer 810 and the remaining sacrificial layer 830 and the polysilicon layer forming the storage node 820.

The removal process of the mold layer 810 and the remaining sacrificial layer 830 is terminated when the upper surface of the first etch stop layer 721 begins to be etched. Substantially, since the silicon nitride layer forming the first etch stop layer 721 has a high etch selection ratio for a silicon oxide, the silicon nitride layer acts as an etch stop layer so that the silicon nitride layer can prevent the third interlayer insulation layer 710 formed below the silicon nitride layer from being etched. Substantially, after such an etching process is terminated, the thickness of the first etch stop layer 721 is preferably above approximately 500 Å.

In the illustrated embodiments, the first etch stop layer 721 is located lower than the landing pad 730b'. Accordingly, after the mold layer 810 and the remaining sacrificial layer 830 are completely removed, the lateral surfaces of the landing pad 730b' are exposed. As a result, as shown in FIG. 8D, the outer lateral surfaces of the storage node 820 are completely exposed and also the landing pad 730b' substantially acts as one portion of the storage node. Accordingly, a storage node 820 with a larger area can be substantially formed.

Figure 9:
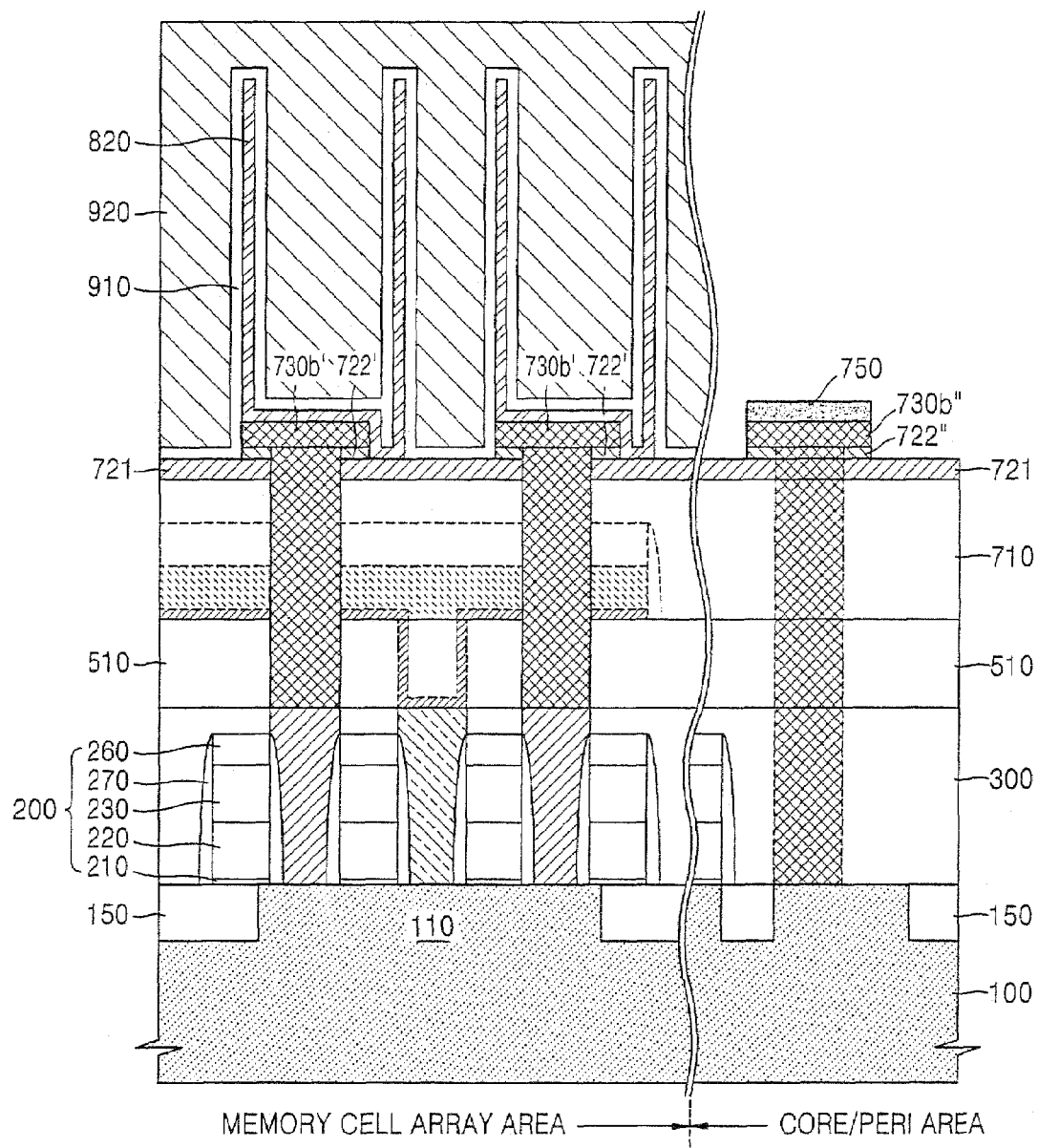

FIG. 9 is a cross-sectional diagram illustrating a process of forming a dielectric film and an upper electrode on the structure of FIG. 8 in accordance with some embodiments of the invention.

Referring to FIG. 9, a dielectric film 910 and a capacitor upper electrode 920 are formed on the resultant structure having the storage node 820. The dielectric film 910 and the capacitor upper electrode 920 can be manufactured using a conventional technique, for example, the dielectric film 910 can be formed with a multilayer oxide-nitride-oxide (ONO) film or can be formed using a high-dielectric material such as a tantalum oxide film or a BST film. Also, the capacitor upper electrode 920 can be formed using a conductive polysilicon or a metal material.

In this case, it is necessary to remove unnecessary dielectric film materials and/or capacitor upper electrode materials after the capacitor upper electrode 920 is formed on the dielectric film 910. At this time, the resistors 730b" formed in the core/perimeter area are protected by the second etch stop layer 750 formed thereon. This is the reason for forming the second etch stop layer on the landing pad and the conductive layer for forming resistors. The second etch stop layer 750 is preferably formed with a material with a high etch selection ratio for the material forming the capacitor upper electrode.

As described above, it is possible to prevent leaning or collapsing of storage nodes by arranging the storage nodes non-linearly in at least one direction and to avoid a two-bit failure by forming storage nodes so that the section of the storage node is a rectangular shape, a circular shape, or an oval shape.

Also, since the entire outer lateral surface of a storage node including the lateral surface of a landing pad located below the storage node can be used as an available surface, it is possible to manufacture a semiconductor memory device including a capacitor with a sufficient capacitance.

Furthermore, it is possible to form resistors in the core/perimeter area without a separate additional process, to easily control a resistance of the resistors, and to efficiently prevent the resistors from being etched in the following processes.

As those of skill in the art will appreciate, there are many ways to practice the invention. What follows are exemplary, non-limiting descriptions of some embodiments of the invention.

According to some embodiments of the invention, there is provided a method of manufacturing a semiconductor memory device that includes: forming an interlayer insulation layer on a semiconductor substrate including a memory cell array area and a core/perimeter area; forming a first etch stop layer on the interlayer insulation layer; forming a plurality of storage node contact plugs on the memory cell array area, which are arranged non-linearly in at least one direction and pass through the first etch stop layer and the interlayer insulation layer to be connected to the semiconductor substrate; forming a landing pad and a first conductive layer for forming resistors, on the first etch stop layer and/or the plurality of contact plugs of the memory cell array area and the core/perimeter area; forming a second etch stop layer on the first conductive layer; etching the second etch stop layer so that a second etch stop layer pattern is arranged non-linearly in at least one direction on the memory cell array area, defines a pattern of the landing pad electrically connected with the plurality of contact plugs, and defines a pattern of the resistors in the core/perimeter area; etching the first conductive layer using the second etch stop layer pattern as an etch mask and forming a plurality of the landing pads and the resistors; and forming a plurality of storage nodes on the plurality of landing pads, respectively, in a manner that the entire outer surface of the storage nodes is exposed.

According to some embodiments of the invention, a process that forms landing pads on a memory cell array area are performed concurrently with a process that forms resistors on the core/perimeter area. Also, it is possible to manufacture storage nodes with a stable structure by additionally forming landing pads between storage nodes and contact plugs on the memory cell array area so that the storage nodes are arranged nonlinearly in at least one direction. In addition, it is possible to ensure a cell capacitor has sufficient capacitance since the entire outer surface of the cell capacitor can be used as an available surface area by forming a first etch stop layer before forming the landing pads.

It is preferable that each of the plurality of landing pads has a width larger than that of the contact plug in a predetermined direction and the plurality of landing pads are arranged in a zig-zag form. If the width of the landing pad becomes wider, electrical connection of the storage nodes and the landing pads can be ensured. Also, if the storage nodes are arranged in a zig-zag form, it is possible to form the storage node in a stable shape.

It is preferable that the plurality of contact plugs and the first conductive layer are formed with the same material and the first conductive layer is formed with polysilicon. Accordingly, the contact plugs and the first conducive layer can be formed together. Also, if the contact plugs and the first conductive layer are formed with the same material, the resistance of resistors formed on the core/perimeter area can be easily controlled.

According to some embodiments of the invention, the plurality of storage nodes are cylindrical storage nodes. In this case, in order to form the cylindrical storage nodes, a mold layer with an opening hole which exposes an upper surface of the second etch stop layer pattern is formed on the resultant structure of the memory cell array area. Then, a second conductive layer for forming a storage node is formed on the second etch stop layer pattern and the mold layer. A buffer layer is formed on the second conductive layer. Successively, nodes of the second conductive layer are divided and the storage nodes are formed. The mold layer and the buffer layer are removed.

According to some embodiments of the invention, it is preferable that the first etch stop layer is formed with a substance including a material with a high etch selection ratio for the mold layer. In this case, the first etch stop layer includes a silicon nitride layer. For example, the first etch stop layer further includes a polysilicon layer formed on the silicon nitride layer. If a polysilicon layer is included in the first etch stop layer, it is possible to easily control the resistance of the resistors formed on the core/perimeter area.

It is preferable that after the storage nodes are formed, a dielectric film is formed on the plurality of storage nodes, and successively a capacitor upper electrode is formed on the dielectric film. Here, the second etch stop layer is formed with a substance including a material with a high etch selection ration for the capacitor upper electrode. In this case, the second etch stop layer pattern formed on the resistors acts to protect the resistors.

It is preferable that a bit line is formed below the interlayer insulation layer before the interlayer insulation layer is formed, the plurality of storage nodes arranged in an oblique direction to each other for a longitudinal direction of the bit line in a manner that the plurality of storage nodes are located in a zig-zag form centered on the bit line. Also, each of the plurality of landing pads has a width larger than that of the contact plug in the direction of the bit line.

According to some embodiments of the invention, there is provided a semiconductor memory device that includes: a semiconductor substrate having a memory cell array area and a core/perimeter area; an interlayer insulation layer that is formed on the semiconductor substrate; a first etch stop layer which is formed on the interlayer insulation layer; a plurality of contact plugs which are arranged non-linearly in at least one direction and are formed on the memory cell array area, the plurality of contact plugs passing through the first etch stop layer and the interlayer insulation layer to be connected to the semiconductor substrate; landing pads which are arranged non-linearly in at least one direction, the landing pads formed on the plurality of contact plugs, the landing pads electrically connected with the plurality of contact plugs, respectively; resistors formed on the core/perimeter area with the same height as the landing pads; and a plurality of storage nodes, the entire outer lateral surfaces of which are exposed, the plurality of storage nodes formed on the landing pads.

While the present invention has been particularly shown and described with reference to exemplary embodiments thereof, it will be understood by those of ordinary skill in the art that various changes in form and details may be made therein without departing from the spirit and scope of the present invention as defined by the following claims.

We claim:

1. A semiconductor memory device comprising:
a semiconductor substrate that includes a memory cell array area and a core/perimeter area;

an interlayer insulation layer formed on the semiconductor substrate;

a first etch stop layer formed on the interlayer insulation layer;

a plurality of contact plugs arranged non-linearly in at least one direction and formed on the memory cell array area, the plurality of contact plugs passing through the first etch stop layer and the interlayer insulation layer to contact the semiconductor substrate;

a plurality of landing pads arranged non-linearly in at least one direction and formed on the plurality of contact plugs, each of the plurality of landing pads electrically connected with one of the plurality of contact plugs;

a plurality of resistors that are formed on the core/perimeter area to the same height as the landing pads; and a plurality of storage nodes, the entire outer lateral surfaces of which are exposed, each of the plurality of storage nodes formed on one of the plurality of landing pads.

2. The device claim 1, wherein the plurality of storage nodes comprises a plurality of cylindrical storage nodes.

3. The device of claim 1, wherein the first etch stop layer comprises a silicon nitride layer.

4. The device of claim 3, wherein the first etch stop layer further comprises a polysilicon layer formed on the silicon nitride layer.

5. The device of claim 1, further comprising a bit line formed below the interlayer insulation layer, the plurality of storage nodes arranged in a oblique direction to each other in a longitudinal direction of the bit line in a manner such that the plurality of storage nodes are arranged in a zig-zag form centering on the bit line.

6. The device of claim 5, wherein each of the plurality of landing pads has a width larger than that of the contact plug in the longitudinal direction of the bit line, near lower portions of the plurality of storage nodes.

7. A semiconductor memory device comprising:

a semiconductor substrate including a memory cell array area and a core/perimeter area;

an interlayer insulation layer on the semiconductor substrate;

a first etch stop layer on the interlayer insulation layer;

a plurality of contact plugs passing through the first etch stop layer and the interlayer insulation layer to contact the semiconductor substrate;

a plurality of landing pads, each of the landing pads formed on one of the plurality of contact plugs;

a plurality of resistors that are formed on the core/perimeter area to the same height as the landing pads; and a plurality of storage nodes, each of the plurality of storage nodes formed on one of the plurality of landing pads, the plurality of storage nodes aligned in no more than one direction chosen from the group consisting of a direction of a bit line and a direction of a gate line.

8. The device of claim 7, wherein each of the plurality of landing pads having a width larger than that of the corresponding contact plug in the direction of the bit line.

* * * * *

UNITED STATES PATENT AND TRADEMARK OFFICE
CERTIFICATE OF CORRECTION

| | | |
|---|---|---|
| PATENT NO. | : 7,329,918 B2 | Page 1 of 1 |
| APPLICATION NO. | : 11/419710 | |
| DATED | : February 12, 2008 | |
| INVENTOR(S) | : Chang-Hyun Cho et al. | |

It is certified that error appears in the above-identified patent and that said Letters Patent is hereby corrected as shown below:

Column 5, line 13, the word "approximatelly" should read -- approximately --.

Signed and Sealed this

Ninth Day of September, 2008

JON W. DUDAS
*Director of the United States Patent and Trademark Office*